United States Patent
Ogane

(10) Patent No.: US 7,038,944 B2
(45) Date of Patent: May 2, 2006

(54) NON-VOLATILE MEMORY DEVICE

(75) Inventor: Junichi Ogane, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/883,698

(22) Filed: Jul. 6, 2004

(65) Prior Publication Data

US 2006/0007740 A1    Jan. 12, 2006

(51) Int. Cl.
*G11C 16/04* (2006.01)
*G11C 16/06* (2006.01)

(52) U.S. Cl. .......................... 365/185.03; 365/185.11; 365/185.2; 365/185.21

(58) Field of Classification Search ........... 365/185.03, 365/185.11, 185.2, 185.21, 185.33
See application file for complete search history.

(56) References Cited

U.S. PATENT DOCUMENTS

| 5,768,191 | A | * | 6/1998 | Choi et al. ............. 365/185.03 |
| 5,805,500 | A | * | 9/1998 | Campardo et al. ........ 365/185.2 |
| 6,052,308 | A | * | 4/2000 | Pitts ...................... 365/185.21 |
| 6,118,695 | A | * | 9/2000 | Yoneyama ............. 365/185.09 |
| 6,154,390 | A | * | 11/2000 | Yang ........................ 365/185.2 |
| 6,166,950 | A | * | 12/2000 | Yamada et al. ......... 365/185.03 |
| 6,278,632 | B1 | * | 8/2001 | Chevallier .............. 365/185.03 |
| 6,320,785 | B1 | * | 11/2001 | Yoshida et al. ......... 365/185.03 |
| 6,483,743 | B1 | * | 11/2002 | Talreja ................... 365/185.03 |

FOREIGN PATENT DOCUMENTS

JP        06-52697        2/1994

* cited by examiner

*Primary Examiner*—Trong Phan
(74) *Attorney, Agent, or Firm*—Nixon Peabody LLP; Donald R. Studebaker

(57) ABSTRACT

A non-volatile memory device includes: a first memory cell array having memory cells, in which one bit data is stored by a plurality of memory cells concurrently; and a second memory cell array having memory cells, in which one bit data is stored by a single memory cell. The device also includes a reference signal generating circuit that generates first and second reference signals, which are used for reading data stored in the first memory cell array and the second memory cell array, respectively; and a sense circuit that accesses the first and second memory cell arrays according to the first and second reference signals, respectively.

20 Claims, 11 Drawing Sheets

NON-VOLATILE MEMORY DEVICE

TECHNICAL FIELD OF THE INVENTION

The present invention relates to a non-volatile memory device, and more particular to, a flash memory that can store a plurality of types of data therein.

BACKGROUND OF THE INVENTION

A non-volatile memory device, such as a flash memory used in a mobile phone, may stores different types of data therein. For example, a flash memory may be fabricated to store a first type of data that is not required a higher reliability, such as audio data, and a second type of data that is required a higher reliability, such as ID, program and phone numbers.

To realize such function of technology, a semiconductor chip including both a flash memory and a EEPROM may be used in an electric device. However, two different fabrication processes are required to make a single chip of memory device, including a flash memory and a EEPROM, so that the fabrication cost would be high.

According to another aspect, a flash memory and an EEPROM are molded in a single package so that non-important data are stored in the flash memory and important data are stored in the EEPROM. However, it is difficult to make a memory device having an optimum amount of storage capacity. Consequently, the memory device costs high.

OBJECTS OF THE INVENTION

An object of the present invention to provide a non-volatile memory device that can store a plurality of different types of data therein without significant increase of costs. Another object of the present invention is to improve a reliability of a certain region of memory cell array.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the present invention, a non-volatile memory device includes: a first memory cell array having memory cells, in which one bit data is stored by a plurality of memory cells concurrently; and a second memory cell array having memory cells, in which one bit data is stored by a single memory cell. The device also includes a reference signal generating circuit that generates first and second reference signals, which are used for reading data stored in the first memory cell array and the second memory cell array, respectively; and a sense circuit that accesses the first and second memory cell arrays according to the first and second reference signals, respectively.

Preferably, the above described non-volatile memory device further includes a X-decoder coupled to gates of the memory cells in the first and second memory cell arrays; a common source line coupled to source of the memory cells in the first and second memory cell arrays; bit lines coupled to drains of the memory cells in the first and second memory cell arrays; column selection switches formed by transistors, drains of which are coupled to the bit lines; and a node coupled to sources of the column selection switches and to the sense circuit.

In the non-volatile memory device, the sense circuit may include a first sense amplifier, which accesses the first memory cell array according to the first reference signal; and a second sense amplifier, which accesses a second memory cell array according to the second reference signal.

Alternately, the sense circuit may include a single sense amplifier, which accesses both the first and second memory cell array according to the first and second reference signals.

Preferably, the same data is written in selected memory cells concurrently in the first memory cell array, and a data is read out simultaneously from the selected memory cells.

The first and second reference signals may be electric current signals or voltage signals. Preferably, the first reference signal is greater than the second reference signal.

For example, a single bit data may be stored by four memory cells concurrently in the second memory cell array. Two, three and more than four memory cells can be used to store a single bit data concurrently in the second memory cell array.

The non-volatile memory device may further include a set-up circuit that generates and stores an activate/inactivate signal supplied to the sense circuit to institute whether a specific region of memory cell array is to be used as the first memory cell array or the second memory cell array.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
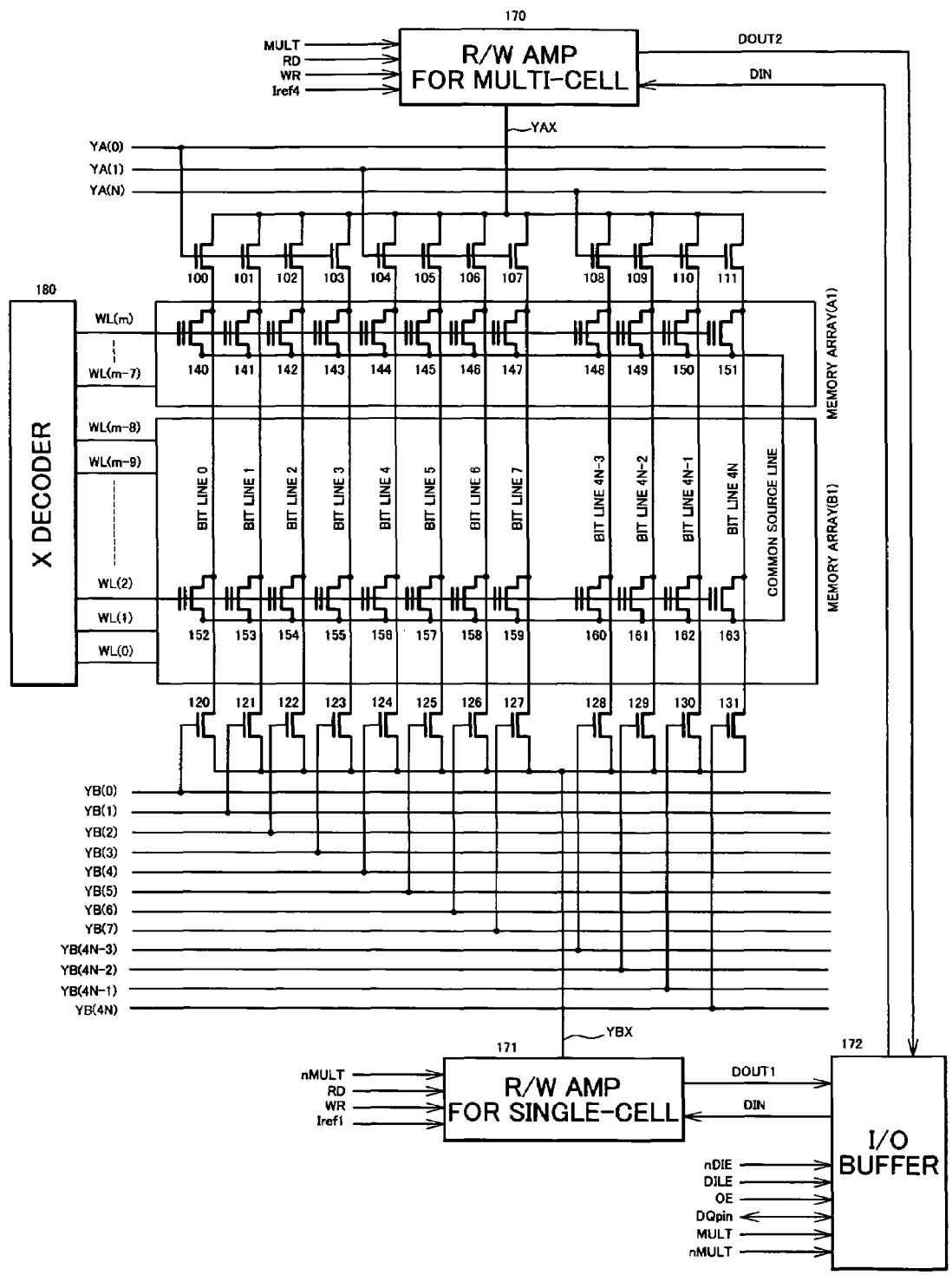
FIG. 1 is a circuit diagram illustrating a non-volatile memory device (flash memory) according to a first preferred embodiment of the present invention.

FIG. 1 is a circuit diagram illustrating a non-volatile memory device (flash memory) according to a first preferred embodiment of the present invention. A non-volatile memory device includes: a first memory cell array A1 having memory cells 140–151, in which one bit data is stored by a plurality of memory cells concurrently; and a second memory cell array B1 having memory cells 152–163, in which one bit data is stored by a single memory cell. The device also includes a reference signal generating circuit, shown in FIG. 6, that generates first and second reference signals Iref1 and Iref4, which are used for reading data stored in the first memory cell array A1 and the second memory cell array B1, respectively; and a sense circuit (170, 171) that accesses the first and second memory cell arrays A1 and B1 according to the first and second reference signals Iref1 and Iref4, respectively.

The non-volatile memory device further includes a X-decoder 180 coupled to gates of the memory cells 140–151 and 152–163 in the first and second memory cell arrays A1 and B1; a common source line coupled to source of the memory cells 140–163 in the first and second memory cell arrays A1 and B1; bit lines 0–4N coupled to drains of the memory cells 140–163 in the first and second memory cell arrays A1 and B1; and column selection switches 100–111 and 120–131 formed by transistors, drains of which are coupled to the bit lines 0–4N. The non-volatile memory device further includes nodes YAX and YBX coupled to sources of the column selection switches 100–111 and 120–131, respectively. The nodes YAX and YBX are also connected to the sense circuit (170, 171).

Gates of the memory cells 140–163 are connected to outputs WL(0)–WL(m) of the X-decoder 180 one by one. Sources of the memory cells 140–163 are coupled to the common source line. The bit lines 0–4N are connected to drains of the column selection switches 100–111 and 120–131. For example, the ends of the bit line "0" are connected to drains of the column selection switches 100 and 120. The ends of the bit line "1" are connected to drains of the column selection switches 101 and 121.

The node YAX, which makes a short-circuit of sources of the column selection switches 100–111 is connected to a Read/Write amplifier 170 for multi-cell storage. Gates of the column selection switches 100–103, 104–107 and 108–111 are connected to YA(0), YA(1) and YA(N), respectively. The node YBX, which makes a short-circuit of sources of the column selection switches 120–131 is connected to a Read/Write amplifier 171 for single-cell storage. Gates of the column selection switches 120–131 are connected to YA(0)–YB(4N) in the order, respectively.

Signals "MULT" and "nMULT" represent activating signals for R/W amplifiers 170 and 171, respectively. "nMULT" is the reverse of "MULT". Output signals DOUT1 and DOUT2 of the R/W amplifiers 170 and 171 are supplied to an input/output buffer 172. The I/O buffer 172 supplies signals DIN to the R/W amplifiers 170 and 171.

Figure 2:
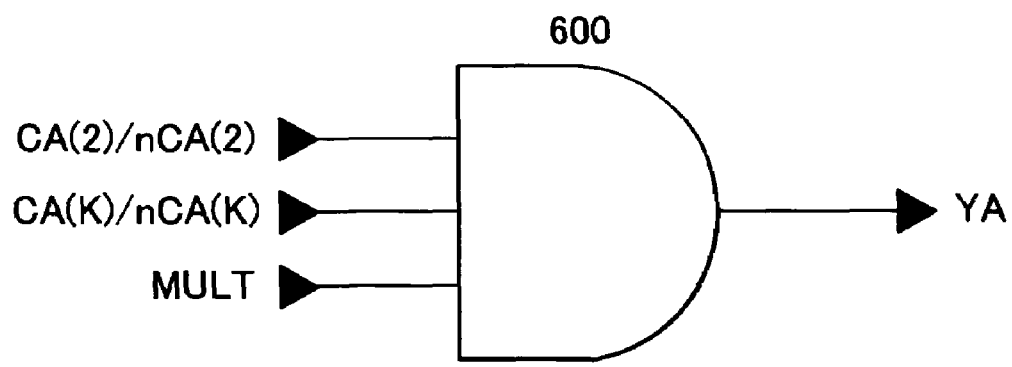
FIG. 2 is a logic diagram showing a column decoder used in the first preferred embodiment shown in FIG. 1.
Figure 2:
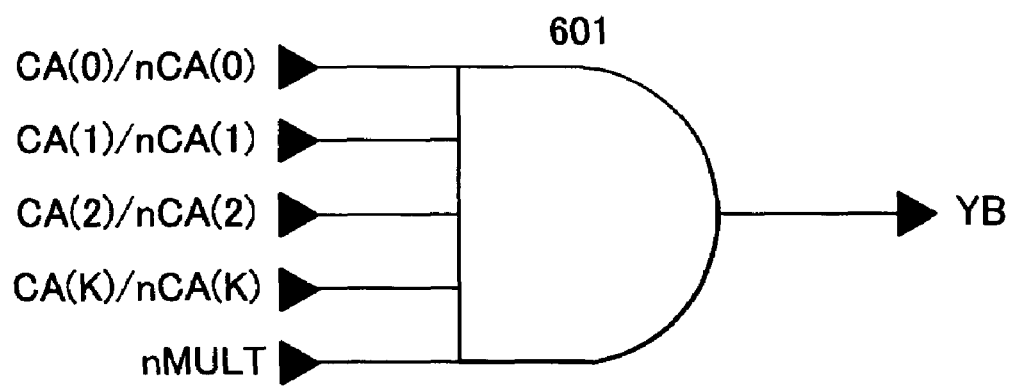

FIG. 2 is a logic diagram showing a column decoder used in the first preferred embodiment shown in FIG. 1. The column decoder includes AND circuits 600 and 601. The AND circuit 600 is supplied with address signals CA(2)/nCA(2) to CA(K)/nCA(K) and the activating signal MULT. The AND circuit 600 supplies an output signal of "YA". The AND circuit 601 is supplied with address signals CA(0)/nCA(0) to CA(K)/nCA(K) and the activating signal nMULT. The AND circuit 601 supplies an output signal of "YB".

Figure 3:
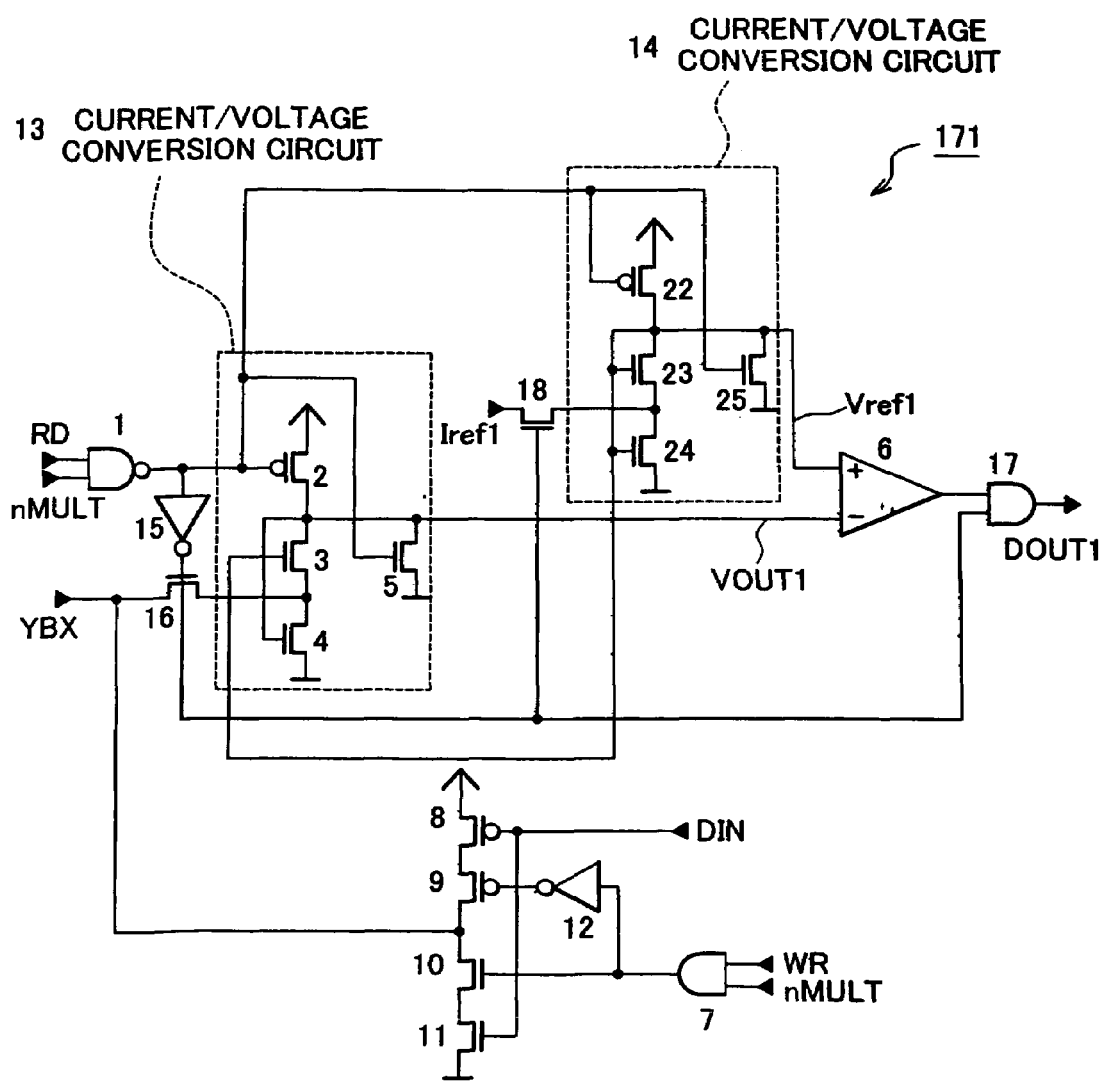
FIGS. 3 and 4 are circuit diagrams showing R/W amplifiers used in the first preferred embodiment shown in FIG. 1.

FIG. 3 is a circuit diagram showing the R/W amplifier 171 used in the first preferred embodiment shown in FIG. 1. The R/W amplifier 171 includes a NAND circuit 1; PMOS transistors 2, 8, 9 and 22; NMOS transistors 3, 4, 10, 11, 16, 18 and 23–25; AND circuits 7– and 17; inverter circuits 12 and 15; and an operational amplifier 6. The NAND circuit 1 includes input terminals to be supplied with a signal RD and the activating signal nMULT and an output terminal, connected to a gate of the PMOS transistor 2, a gate of the NMOS transistor 5 and to an input terminal of the inverter 15. A drain of the PMOS transistor 2 is connected through a node VOUT1 to a source of the NMOS transistor 3, a gate of the NMOS transistor 4 and to a drain of the NMOS transistor 5.

Sources of the NMOS transistors 4 and 5 are grounded. The PMOS transistor 2 and the NMOS transistors 3–5 form a current/voltage conversion circuit 13. The node VOUT1 is an output of the current/voltage conversion circuit 13. For an input of the current/voltage conversion circuit 13, a drain of the NMOS transistor 16 is connected to drains of the NMOS transistors 3 and 4, and a gate and a source of the NMOS transistor 16 is connected to an output terminal of the inverter 15 and the node YBX, respectively.

A drain of the PMOS transistor 22 is connected to source and gate of the NMOS transistor 23, a gate of the NMOS transistor 24 and to a drain of the NMOS transistor 25 through a node Vref1. Source of the NMOS transistors 24 and 25 are grounded. A source of the PMOS transistor 22 is connected to a power supply. Gates of the PMOS transistor 22 and the NMOS transistor 25 are connected to an output terminal of the NAND circuit 1. The PMOS transistor 22 and NMOS transistors 23–25 forms a current/voltage conversion circuit 14. An output of the current/voltage conversion circuit 14 is a signal Vref1.

For an input of the current/voltage conversion circuit 14, a drain of the NMOS transistor 18 is connected to drains of the NMOS transistors 23 and 24, and a gate and a source of the NMOS transistor 18 is connected to an output terminal of the inverter 15 and a reference level Iref1. An output node Vref1 of the current/voltage conversion circuit 14 is also connected to a gate of the NMOS transistor 3, forming the other current/voltage conversion circuit 13.

Output signals VOUT1 and Vref1 of the current/voltage conversion circuits 13 and 14 are connected to input terminals of the op-amplifier 6. An output terminal of the op-amplifier 6 is connected to an input terminal of the AND circuit 17. The other input terminal of the AND circuit 17 is connected to an output terminal of the inverter 15. An output signal DOUT1 is supplied from the AND circuit 17.

A drain of the PMOS transistor 8 and a source of the PMOS transistor 9 are connected serially. A source of the PMOS transistor 8 is connected to a power supply. A source of the NMOS transistor 10 and a drain of the NMOS transistor 11 are connected serially. A source of the NMOS transistor 10 is grounded. A drain of the PMOS transistor 9 and a drain of the NMOS transistor 10 are connected each other to form a an output node. Gates of the PMOS transistor 8 and the NMOS transistor 11 are connected to an input node DIN. Signals WR and nMULT are supplied to an input terminal of the AND circuit 7, an output terminal of which is connected to an input terminal of the inverter 12. A gate of the NMOS transistor 10 is connected to an output terminal of the AND circuit 7. Drains of the PMOS transistor 9 and NMOS transistor 10 are connected to a node YBX.

Figure 4:
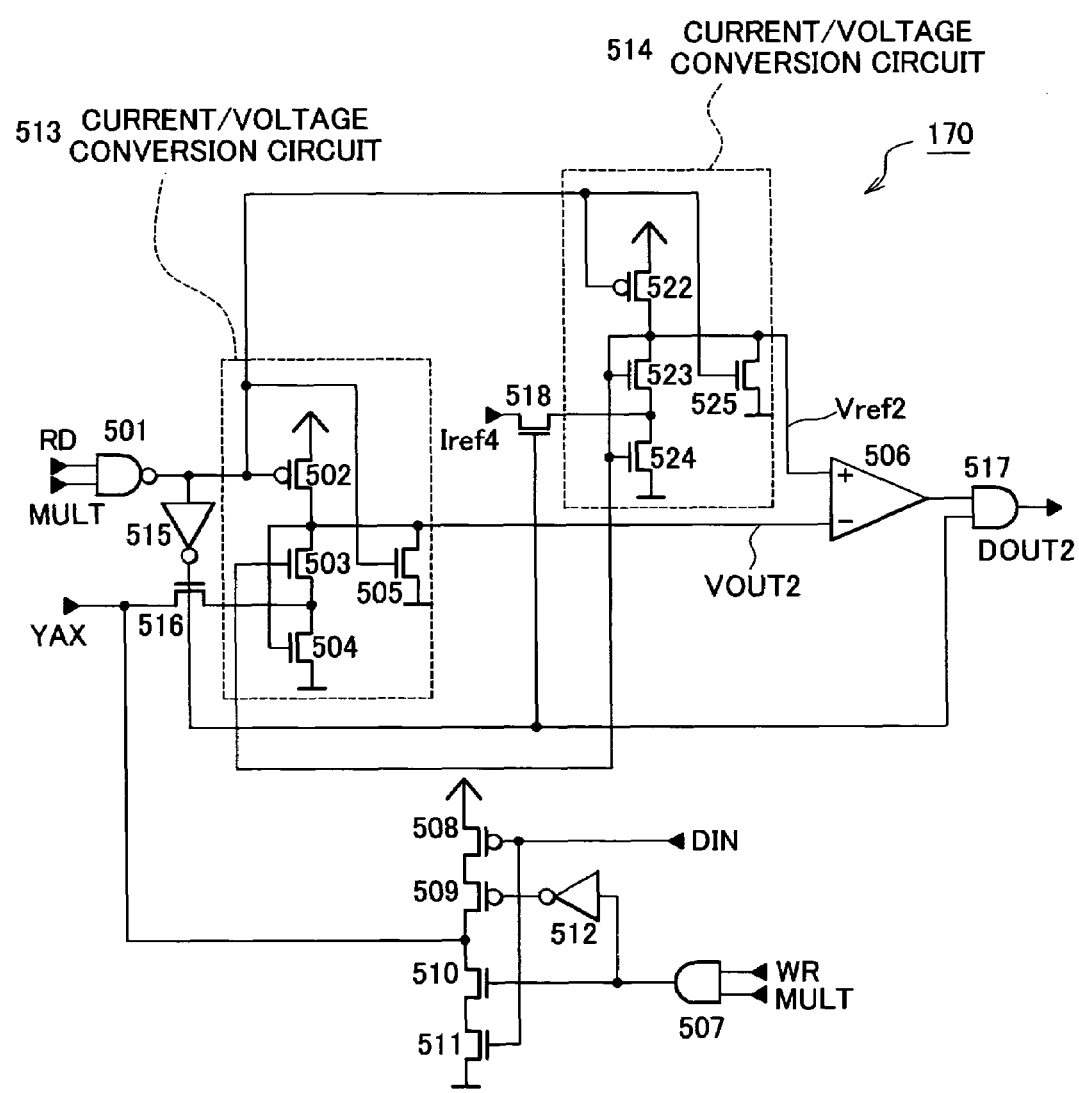

FIG. 4 is a circuit diagram showing the R/W amplifier 170 used in the first preferred embodiment shown in FIG. 1. The R/W amplifier 170 includes a NAND circuit 501; PMOS transistors 502, 508, 509 and 522; NMOS transistors 503, 504, 510, 511, 516, 518 and 523–525; AND circuits 507 and 517; inverter circuits 512 and 515; and an operational amplifier 506. The NAND circuit 501 includes input terminals to be supplied with a signal RD and the activating signal MULT and an output terminal, connected to a gate of the PMOS transistor 502, a gate of the NMOS transistor 505 and to an input terminal of the inverter 515. A drain of the PMOS transistor 502 is connected through a node VOUT2 to a source of the NMOS transistor 503, a gate of the NMOS transistor 504 and to a drain of the NMOS transistor 505.

Sources of the NMOS transistors 504 and 505 are grounded. The PMOS transistor 502 and the NMOS transistors 503–505 form a current/voltage conversion circuit 513. The node VOUT2 is an output of the current/voltage conversion circuit 513. For an input of the current/voltage conversion circuit 513, a drain of the NMOS transistor 516 is connected to drains of the NMOS transistors 503 and 504, and a gate and a source of the NMOS transistor 516 is connected to an output terminal of the inverter 515 and the node YAX, respectively.

A drain of the PMOS transistor 522 is connected to source and gate of the NMOS transistor 523, a gate of the NMOS transistor 524 and to a drain of the NMOS transistor 525 through a node Vref2. Source of the NMOS transistors 524 and 525 are grounded. A source of the PMOS transistor 522 is connected to a power supply. Gates of the PMOS transistor 522 and the NMOS transistor 525 are connected to an output terminal of the NAND circuit 501. The PMOS transistor 522 and NMOS transistors 523–525 forms a current/voltage conversion circuit 514. An output of the current/voltage conversion circuit 514 is a signal Vref2.

For an input of the current/voltage conversion circuit 514, a drain of the NMOS transistor 518 is connected to drains of the NMOS transistors 523 and 524, and a gate and a source of the NMOS transistor 518 is connected to an output terminal of the inverter 515 and a reference level Iref4. An output node Vref2 of the current/voltage conversion circuit 514 is also connected to a gate of the NMOS transistor 503, forming the other current/voltage conversion circuit 513.

Output signals VOUT2 and Vref2 of the current/voltage conversion circuits 513 and 514 are connected to input terminals of the op-amplifier 506. An output terminal of the op-amplifier 506 is connected to an input terminal of the AND circuit 517. The other input terminal of the AND circuit 517 is connected to an output terminal of the inverter 515. An output signal DOUT2 is supplied from the AND circuit 517.

A drain of the PMOS transistor 508 and a source of the PMOS transistor 509 are connected serially. A source of the PMOS transistor 508 is connected to a power supply. A source of the NMOS transistor 510 and a drain of the NMOS transistor 511 are connected serially. A source of the NMOS transistor 510 is grounded. A drain of the PMOS transistor 509 and a drain of the NMOS transistor 510 are connected each other to form a an output node. Gates of the PMOS transistor 508 and the NMOS transistor 511 are connected to an input node DIN. Signals WR and MULT are supplied to an input terminal of the AND circuit 507, an output terminal of which is connected to an input terminal of the inverter 512. A gate of the NMOS transistor 510 is connected to an output terminal of the AND circuit 507. Drains of the PMOS transistor 509 and NMOS transistor 510 are connected to a node YAX.

Figure 5:
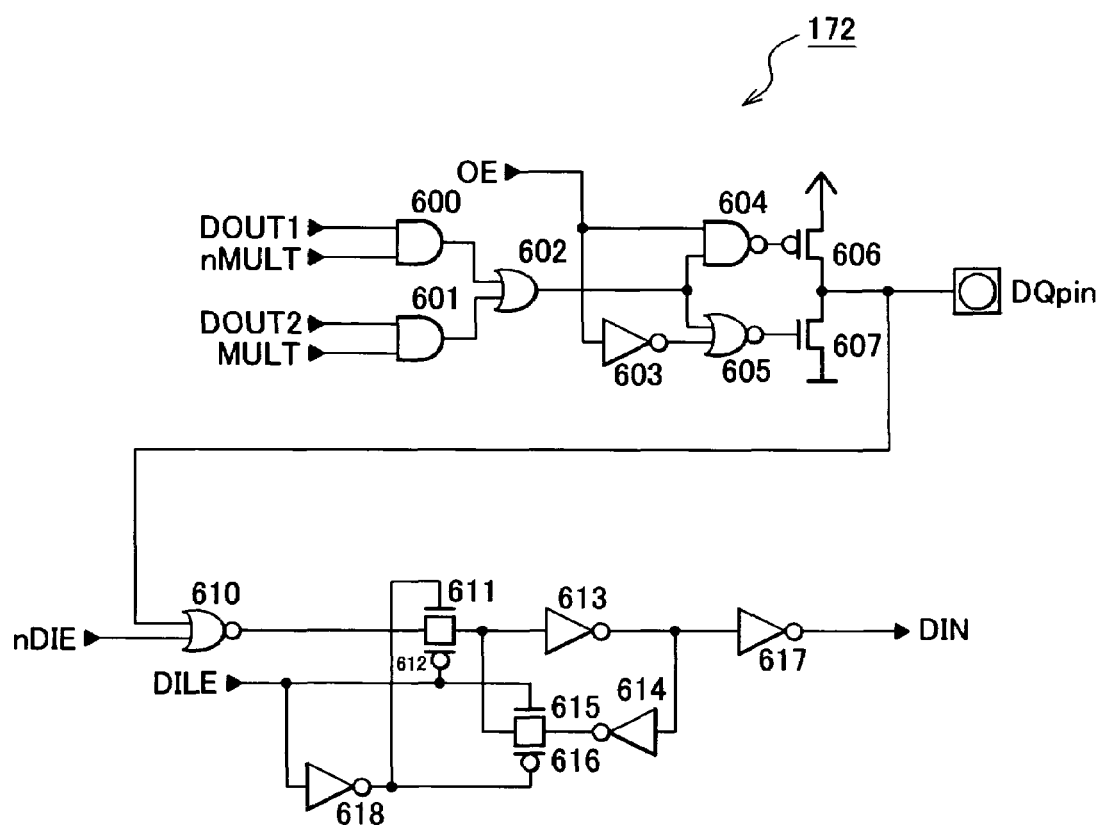
FIG. 5 is a circuit diagram showing an I/O buffer used in the first preferred embodiment shown in FIG. 1.

FIG. 5 is a circuit diagram showing an I/O buffer used in the first preferred embodiment shown in FIG. 1. The I/O buffer 172 includes AND circuits 600 and 601; an OR circuit 602; inverter circuits 603, 613, 614, 617 and 618; a NAND circuit 604; NOR circuits 605 and 610; PMOS transistors 606, 611 and 615; and NMOS transistors 607, 612 and 616. An input terminal of the AND circuit 600 is supplied with signals DOUT1 and nMULT. An input terminal of the AND circuit 601 is supplied with signals DOUT2 and MULT. Output terminals of the AND circuits 600 and 601 are connected to an input terminal of the OR circuit 602. An output terminal of the OR circuit 602 is connected to input terminals of the NAND circuit 604 and NOR circuit 605.

A signal OE is supplied to the other input terminal of the NAND circuit 604. The signal OE is also supplied to an input terminal of the inverter 603, an output terminal of which is connected to the other input terminal of the NOR circuit 605. An output terminal of the NAND circuit 604 is connected to a gate of the PMOS transistor 606. An output terminal of the NOR circuit 605 is connected to a gate of the NMOS transistor 607. Drains of the PMOS transistor 606 and the NMOS transistor 607 are commonly connected to a terminal DQpin. Source of the PMOS transistor 606 and the NMOS transistor 607 are connected to a power supply and a ground (earth), respectively.

Input terminals of the NOR circuit 610 are supplied with signals DQpin and nDIE. An output terminal of the NOR circuit 610 is connected to source of the NMOS transistor 611 and PMOS transistor 612. A common drain of the NMOS transistor 611 and PMOS transistor 612 is connected to an input terminal of the inverter 613 and to a common drain of the NMOS transistor 615 and PMOS transistor 616. A common source of the NMOS transistor 615 and PMOS transistor 616 is connected to an output terminal of the inverter 614. Input terminals of the inverters 614 and 617 are connected to an output terminal of the inverter 613. An output signal of the inverter 617 is a signal DIN. A signal DILE is supplied to gates of the PMOS transistor 612 and NMOS transistor 615 and to an input terminal of the inverter 618. An output signal of the inverter 618 is supplied to gates of the NMOS transistor 611 and PMOS transistor 616.

Figure 6:
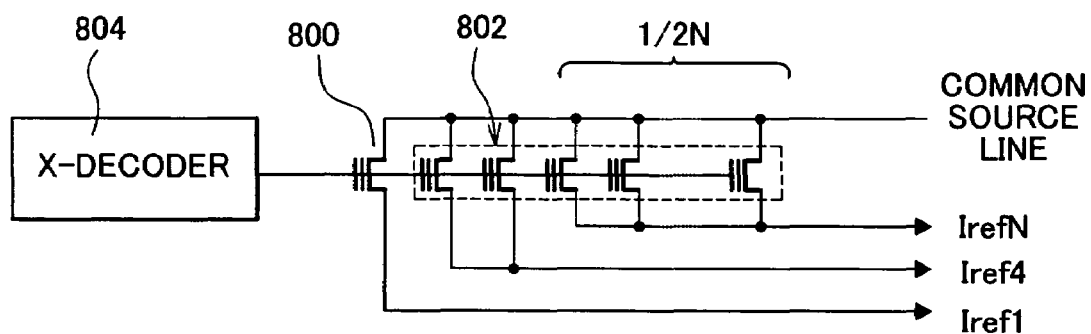
FIG. 6 is a circuit diagram showing a reference current generator used in the first preferred embodiment shown in FIG. 1.

FIG. 6 is a circuit diagram showing a reference current generator used in the first preferred embodiment shown in FIG. 1. The reference current generator includes a X-decoder circuit 804; a first type of transistor (cell) 800 and a second type of transistors (cells) 502. The X-decoder 804 supplies a gate voltage for reading operation of reference cells (800, 802). The transistor 800 is designed to have a channel width that is a half of the memory cells 140–163. Each of the transistors 802 is designed to have a channel width that is the same as the memory cells 140–163. Sources of the transistors 800 and 802 are connected to the common source line, to which source of the memory cells 140–163 are also connected, so that the same voltage dependency of I–V is obtained.

The transistors 800 and 802 are designed to have the same structure as the memory cells 140–163, so that the same temperature dependency of I–V is obtained. The transistors 800 and 802 may be arranged in the memory cell arrays A1 and B1. The reference current Iref1 is supplied from a drain of the transistor 800. The reference current Iref4 is supplied from drains of a couple of transistors 802. A reference current IrefN is supplied from drains of N/2 of the transistors 802.

In the first preferred embodiment, when a X address for selecting word lines WL(m-7) to WL(m) is entered, the activating signal MULT becomes "1". To detect the value of the activating signal MULT, for example, a kind of simple decoder, detecting a specific combination of input from a X address, may be used.

When the activating signal MULT is "0", the reverse signal nMULT is "1" and all of YA(0) to YA(N) are non-selected. In response to the activating signal MULT of "0", the PMOS transistor 502 and the NMOS transistor 516 are turned off in the R/W amplifier 170. An output signal of the AND circuit 517 is maintained at "0", and the PMOS transistor 509, the NMOS transistor 510, the PMOS transistor 522 and the NMOS transistor 518 are turned off. As a result, the R/W amplifier for multi-cell 170 is inactivated regardless values of input signals RD, Iref4 and DIN.

On the other hand, one is selected from the terminals YB(0) to YB(4N) in accordance with an input address CA(0) to CA(K). The R/W amplifier for single-cell 171 is activated in accordance with the activating signal nMULT of "1" when an input signal RD or WR is "1".

In reading operation, when the read signal RD is "1" and the activating signal nMULT is "1", the NAND circuit 1 supplies an output of "0", and the inverter 15 supplies an output of "1". Both the PMOS transistor 2 and the NMOS transistor 16 are turned on and the NMOS transistor 5 is turned off, so that the current-voltage conversion circuit 13 is activated. In the same manner, both the PMOS transistor 22 and the NMOS transistor 18 are turned on and the NMOS transistor 25 is turned off, so that the current-voltage conversion circuit 14 is activated.

The amount of current flowing through the NMOS transistor 24 is defined by adding the amounts of current flowing through the NMOS transistors 23 and 18. In the same manner, the amount of current flowing through the NMOS transistor 4 is defined by adding the amounts of current flowing through the NMOS transistors 3 and 16. When the amount of current from YBX is equal to the reference current Iref1, the signals VOUT1 and Vref1 have the same voltage level.

In more detail, when a current that is larger than the reference current Iref1 is supplied from YBX, the amount of current flowing through the NMOS transistor 16 is increased. As a result, the current flowing through the NMOS transistor 3 is limited and an output VOUT1 of the current/voltage conversion circuit 13 is increased. When an output voltage VOUT1 of the current/voltage conversion circuit 13 becomes larger than a reference voltage Vref1, which is an output of the current/voltage conversion circuit 14, according to the operation of the op-amplifier 6, the output level of the op-amplifier 6 is turned to low level and the AND circuit 17 supplies an output signal of "0".

In contrast, when a current that is not larger than the reference current Iref1 is supplied from YBX, the amount of current flowing through the NMOS transistor 3 is increased. As a result, an output VOUT1 of the current/voltage conversion circuit 13 is decreased. When an output voltage VOUT1 of the current/voltage conversion circuit 13 becomes lower than a reference voltage Vref1, which is an output of the current/voltage conversion circuit 14, according to the operation of the op-amplifier 6, the output level of the op-amplifier 6 is turned to high level and the AND circuit 17 supplies an output signal of "1".

In writing operation, when both signals WR and nMULT become "1", the AND circuit 7 supplies an output signal "1" and the inverter 12 supplies an output signal "0". Both the PMOS transistor 9 and NMOS transistor 10 are turned on, a reverse data of DIN is outputted to the terminal YBX. When the signal DIN is "0", the PMOS transistors 8 and 9 are turned on, and the NMOS transistors 10 and 11 are turned off. As a result, drains of the PMOS transistors 9 and 10 becomes a power supply level. On the other hand, when the signal DIN is "1", the PMOS transistors 8 and 9 are turned off, and the NMOS transistors 10 and 11 are turned off. As a result, drains of the PMOS transistors 9 and 10 becomes a ground level.

A voltage at the terminal YBX is applied to a drain of a memory cell that is arranged at an intersection of one from YB(0) to YB(4N) and one from word lines WL(0) to WL(m-8), which are selected based on a write address. In writing operation, one of the word lines WL(0) to WL(m-8) is at a high voltage level and a predetermined data is written in the corresponding memory cell. Although, in the first preferred embodiment, a drain voltage of a memory cell in writing operation is determined lower than a power supply level, voltage (electrical potential) condition may be changed.

Next, the operation with the I/O buffer 172 will be described. Referring FIG. 5, a selector, formed by the AND circuits 600 and 601 and the OR circuit 602, transfers a signal DOUT1=1 to an output terminal of the OR circuit 602 a signal DOUT1=0 to an output terminal of the OR circuit 602, when the activating signals nMULT and MULT are "1" and "0", respectively. The selector transfers a signal DOUT2=1 to an output terminal of the OR circuit 602 a signal DOUT2=0 to an output terminal of the OR circuit 602, when the activating signals nMULT and MULT are "0" and "1", respectively.

When an output enable signal OE is "1", the chip is in an output mode, so that an output signal of DOUT1 or DOUT2 is outputted through the terminal DQpin. In this case, nDIE is "1" and DILE is "1".

In writing operation, both the signals nDIE and DILE is "0". In response to a "0" level of the signal nDIE, the NOR circuit 610 is activated, and an input level of the signal DQpin is reversed and supplied to a transfer gate, formed by the NMOS transistor 611 and the PMOS transistor 612. In such a transfer gate, the PMOS transistor 612 and the NMOS transistor 611 are in the on state when the signal DILE is "0". A gate of the NMOS transistor is supplied with a signal, which is reversed by the inverter 618. An output signal of the NOR circuit 610 is supplied to an input terminal of the inverter 613. An output of the inverter 613 is reversed by the inverter 614 and the inverter 617. An output signal of the inverter 617 is supplied to R/W amplifiers 170 and 171 as a signal DIN. In this case, the transfer gate, formed by the NMOS transistor 615 and the PMOS transistor 616, is maintained being off.

While the signal DILE is "1", a transfer gate formed by the PMOS transistor 612 and the NMOS transistor 611 is in the off state, and a transfer gate formed by the NMOS transistor 615 and the PMOS transistor 616 is in the on state. A data transferred to an output terminal of the inverter 613 during a period of time in which the signal DILE is "0" is reversed by the inverter 614. The reversed data is again transferred to an input terminal of the inverter 613 through a transfer gate, formed by the NMOS transistor 615 and the PMOS transistor 616. As a result, a data transferred to an output terminal of the inverter 613 during a period of time in which the signal DILE is maintained at "0" is buffered.

When the activating signal MULT is "1", the reverse signal nMULT is "0" and all of YB(0) to YB(4N) are non-selected. As a result the R/W amplifier for single-cell 171 is inactivated. On the other hand, one is selected from the terminals YA(0) to YA(N) in accordance with an input address CA(2) to CA(K). The R/W amplifier for multi-cell 170 is activated in accordance with the activating signal MULT of "1" when an input signal RD or WR is "1".

In reading operation, when the read signal RD is "1" and the activating signal nMULT is "1", the NAND circuit 501 supplies an output of "0", and the inverter 515 supplies an output of "1". Both the PMOS transistor 502 and the NMOS transistor 516 are turned on and the NMOS transistor 505 is turned off, so that the current-voltage conversion circuit 513 is activated. In the same manner, both the PMOS transistor 522 and the NMOS transistor 518 are turned on and the NMOS transistor 525 is turned off, so that the current-voltage conversion circuit 514 is activated.

The amount of current flowing through the NMOS transistor 524 is defined by adding the amounts of current flowing through the NMOS transistors 523 and 518. In the same manner, the amount of current flowing through the NMOS transistor 504 is defined by adding the amounts of current flowing through the NMOS transistors 503 and 516. If the amount of current from YAX is equal to the reference current Iref4, the signals VOUT2 and Vref2 would have the same voltage level.

In more detail, when a current that is larger than the reference current Iref4 is supplied from YAX, the amount of current flowing through the NMOS transistor 516 is increased. As a result, the current flowing through the NMOS transistor 503 is limited and an output VOUT2 of the current/voltage conversion circuit 513 is increased. When an output voltage VOUT2 of the current/voltage conversion circuit 513 becomes larger than a reference voltage Vref2, which is an output of the current/voltage conversion circuit 514, according to the operation of the op-amplifier 506, the output level of the op-amplifier 506 is turned to low level and the AND circuit 517 supplies an output signal of "0".

In contrast, when a current that is not larger than the reference current Iref4 is supplied from YAX, the amount of current flowing through the NMOS transistor 503 is increased. As a result, an output VOUT2 of the current/voltage conversion circuit 513 is decreased. When an output voltage VOUT2 of the current/voltage conversion circuit 513 becomes lower than a reference voltage Vref2, which is an output of the current/voltage conversion circuit 514, according to the operation of the op-amplifier 506, the output level of the op-amplifier 506 is turned to high level and the AND circuit 517 supplies an output signal of "1".

The reference current Iref4 for the R/W amplifier for multi-cell 170 is determined to be larger than the reference current Iref1 for the R/W amplifier for single-cell 171. According to the embodiment, the reference current Iref4 is determined to be double of the reference current Iref1, and data stored in the corresponding four memory cells are read out simultaneously. Even if one piece of data stored in a memory cell has been reversed accidentally, a desired accurate data would be outputted as long as the other three memory cells store the same and right data.

Here, it is assumed that an amount of an ON current for each memory cell is represented by "I-cell", reference currents may be as follows:

Single Cell Reading Mode: 1/2(I-cell)

Four Cell Reading Mode: 1/2(4*(I-cell))=2(I-cell)

N Cell Reading Mode: 1/2(N*(I-cell))

The above formulas can be applied to the following second and third preferred embodiments.

In writing operation, when both signals WR and MULT become "1", the AND circuit 507 supplies an output signal "1" and the inverter 512 supplies an output signal "0". Both the PMOS transistor 509 and NMOS transistor 510 are turned on, a reverse data of DIN is outputted to the terminal YAX. When the signal DIN is "0", the PMOS transistors 508 and 509 are turned on, and the NMOS transistors 510 and 511 are turned off. As a result, drains of the PMOS transistors 509 and 510 becomes a power supply level. On the other hand, when the signal DIN is "1", the PMOS transistors 508 and 509 are turned off, and the NMOS transistors 510 and 511 are turned off. As a result, drains of the PMOS transistors 509 and 510 becomes a ground level.

A voltage at the terminal YAX is applied to a drain of a memory cell that is arranged at an intersection of one from YA(0) to YA(N) and one from word lines WL(m-7) to WL(m), which are selected based on a write address. In writing operation, one of the word lines WL(m-7) to WL(m) is at a high voltage level and a predetermined data is written in the four corresponding memory cells at the same time. Although, in this embodiment, a drain voltage of a memory cell in writing operation is determined lower than a power supply level, voltage (electrical potential) condition may be changed.

According to this preferred embodiment, for example, even if a contact connecting a drain of the memory cell 143 and a bit line 3 is broken and disconnected, data read from the memory cells 140–143 keeps an expected value as long as the other memory cells 140–142 stores the accurate data.

In the same manner, for example, even if the memory cell 143 is damaged and cannot store a data "1" therein, data read from the memory cells 140–143 keeps an expected value as long as the accurate data "1" are written in the other memory cells 140–142.

As described above, according to the first preferred embodiment of the present invention, the same data is written in a plurality of memory cells concurrently and the data are read out simultaneously. The reading operation is carried out with a reference current, which is larger than that in case a data is read out from a single memory cell. As a result, even if one of memory cells does not work and stores a reversed data, an output would have an expected data accurately.

Further, the non-volatile memory device includes a memory cell array in which a single bit data is stored in a single memory cell one-by-one, so that data that is not required high reliability such as audio data can be stored in those memory cells. On the other hand, data that is required a high reliability and to be rewritten frequently such as ID code and phone numbers can be stored in memory cells one bit per four cells. Even if a memory cell is originally damaged in a fabrication process such as a bit-contact-open failure, data stored and read out simultaneously from four memory cells may keep its reliability and accuracy.

Figure 7:
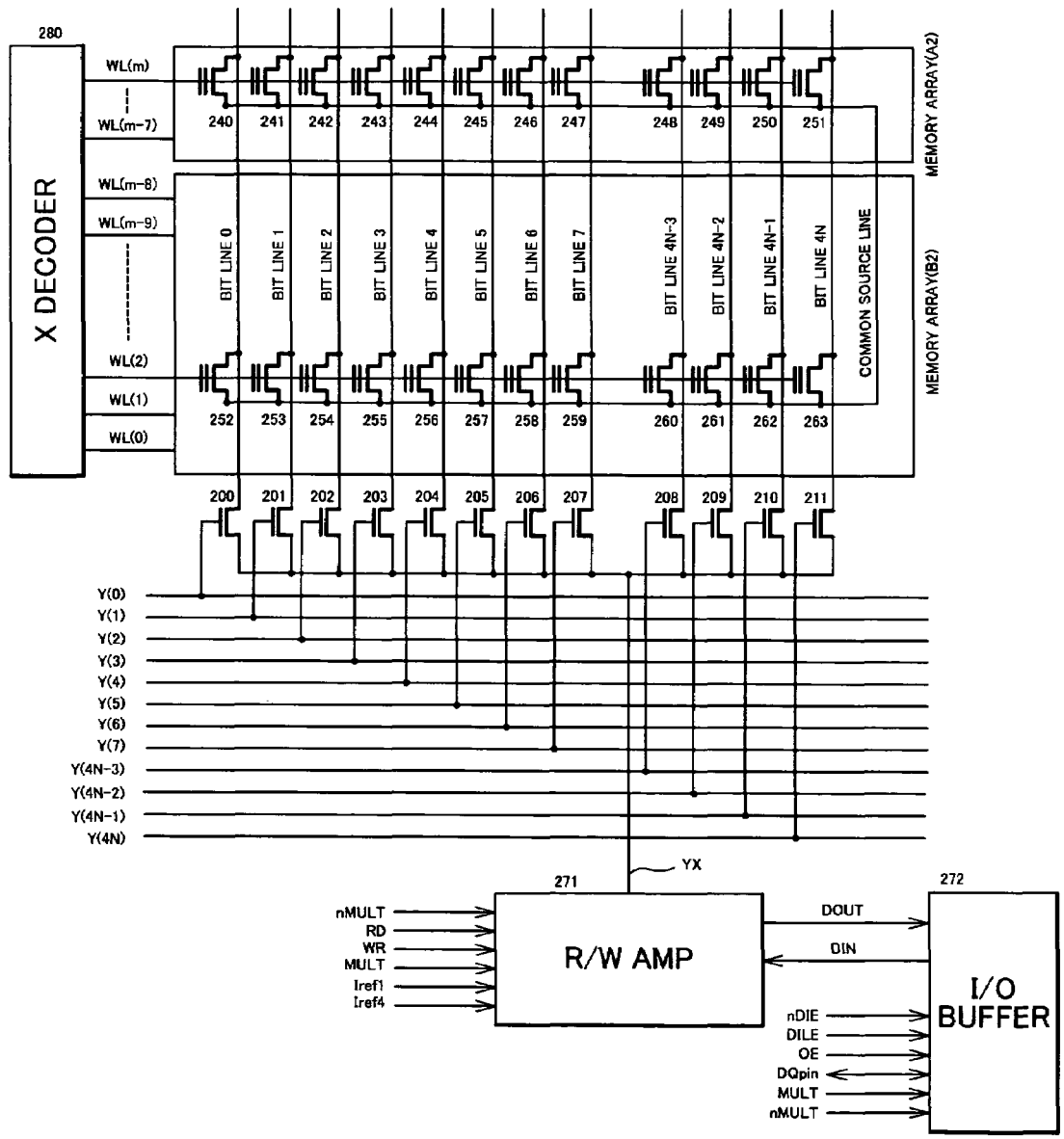
FIG. 7 is a circuit diagram illustrating a non-volatile memory device (flash memory) according to a second preferred embodiment of the present invention.

FIG. 7 is a circuit diagram illustrating a non-volatile memory device (flash memory) according to a second preferred embodiment of the present invention. A non-volatile memory device includes: a first memory cell array A2 having memory cells 240–251, in which one bit data is stored by four memory cells concurrently; and a second memory cell array B2 having memory cells 252–263, in which one bit data is stored by a single memory cell. The device also includes a reference signal generating circuit, shown in FIG. 6, that generates first and second reference signals Iref1 and Iref4, which are used for reading data stored in the first memory cell array A1 and the second memory cell array B1, respectively; and a sense circuit 271 that accesses the first and second memory cell arrays A2 and B2 according to the first and second reference signals Iref1 and Iref4, respectively.

The non-volatile memory device further includes a X-decoder 280 coupled to gates of the memory cells 240–251 and 252–263 in the first and second memory cell arrays A2 and B2; a common source line coupled to source of the memory cells 240–263 in the first and second memory cell arrays A2 and B2; bit lines 0–4N coupled to drains of the memory cells 240–263 in the first and second memory cell arrays A2 and B2; and column selection switches 200–211 formed by transistors, drains of which are coupled to the bit lines 0–4N. The non-volatile memory device further includes nodes YX coupled to sources of the column selection switches 200–211, which are connected to the sense circuit 271.

Gates of the memory cells 240–263 are connected to outputs WL(0)–WL(m) of the X-decoder 280 one by one. Sources of the memory cells 240–263 are coupled to the common source line. The bit lines 0–4N are connected to drains of the column selection switches 200–211. For example, one end of the bit line "0" is connected to drains of the column selection switches 200. One end of the bit line "1" is connected to drains of the column selection switches 201.

The node YX, which makes a short-circuit of sources of the column selection switches 200–211 is connected to a Read/Write amplifier 271. Gates of the column selection switches 200–211 are connected to Y(0) to Y(4N) in the order, respectively.

Signals "MULT" and "nMULT" are activating signals for R/W amplifier 271. "nMULT" is the reverse of "MULT". An output signal DOUT of the R/W amplifier 271 is supplied to an input/output buffer 272. The I/O buffer 272 supplies signals DIN to the R/W amplifier 271.

Figure 8:
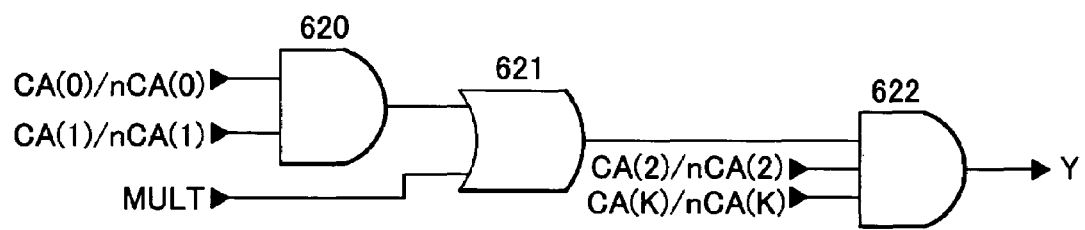
FIG. 8 is a logic diagram showing a column decoder used in the second preferred embodiment shown in FIG. 7.

FIG. 8 is a logic diagram showing a column decoder used in the second preferred embodiment shown in FIG. 7. The column decoder includes AND circuits 620 and 622, and an OR circuit 621. The AND circuit 620 is supplied with address signals CA(0)/nCA(0) to CA(1)/nCA(1). An output terminal of the AND circuit 620 is connected to an input terminal of the OR circuit 621. The other input terminal of the OR circuit 621 is supplied with the activating signal MULT. An output terminal of the OR circuit 621 is connected to an input terminal of the AND circuit 622. The AND circuit 622 supplies an output signal of "Y". The AND circuit 6221 is supplied with address signals CA(2)/nCA(2) to CA(K)/nCA(K).

Figure 9:
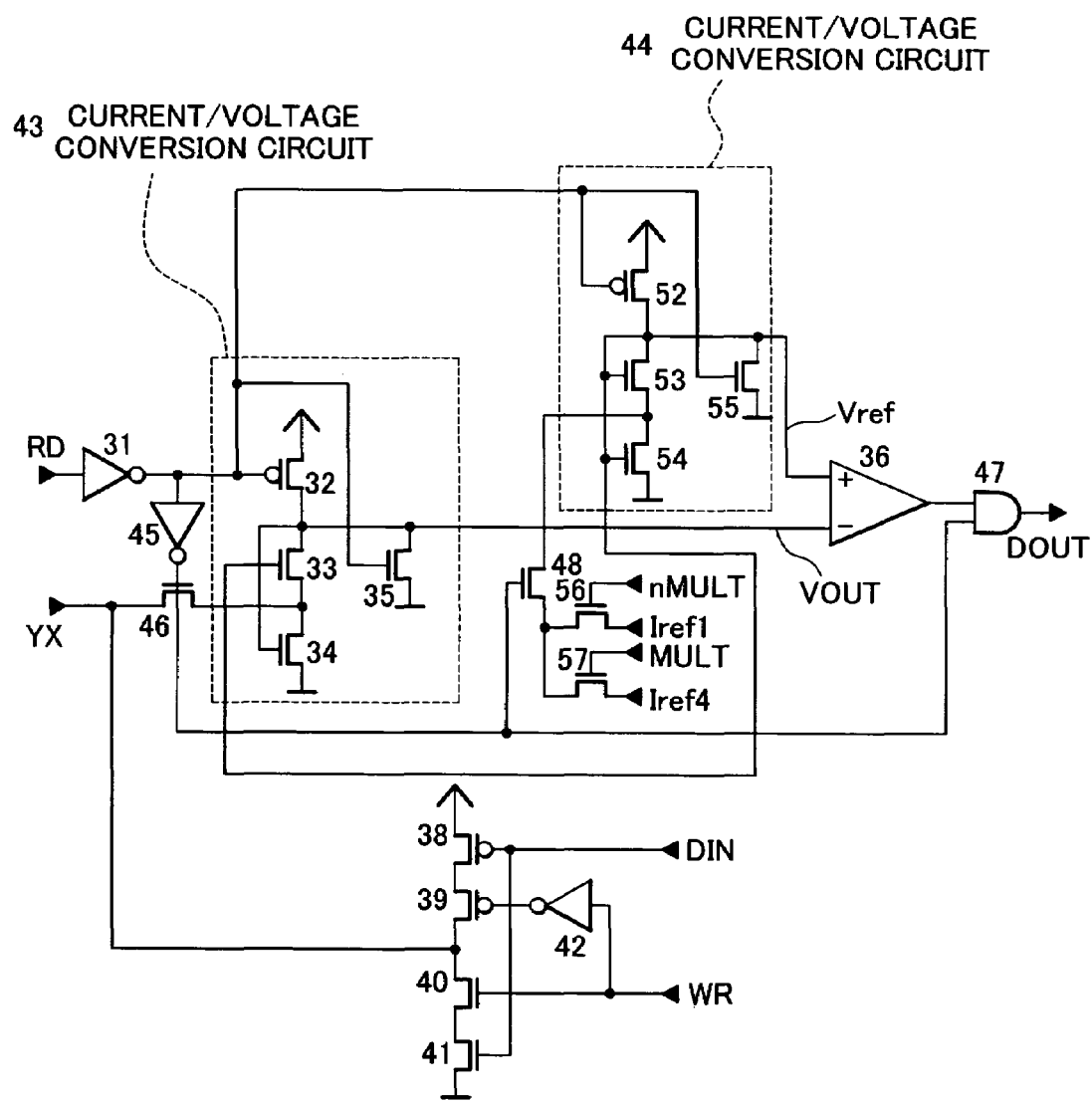
FIG. 9 is a circuit diagram showing a R/W amplifier used in the second preferred embodiment shown in FIG. 7.

FIG. 9 is a circuit diagram showing the R/W amplifier 271 used in the second preferred embodiment shown in FIG. 7. The R/W amplifier 171 includes PMOS transistors 32, 38, 39 and 52; NMOS transistors 33, 34, 40, 41, 46, 48 and 53–57; an AND circuit 47; inverter circuits 31, 42 and 45; and an operational amplifier 46. The inverter 31 is supplied with a signal RD. An output terminal of the inverter 31 is connected to a gate of the PMOS transistor 32, a gate of the NMOS transistor 35 and to an input terminal of the inverter 45. A drain of the PMOS transistor 32 is connected through a node VOUT to a source of the NMOS transistor 33, a gate of the NMOS transistor 34 and to a drain of the NMOS transistor 35.

Sources of the NMOS transistors 34 and 35 are grounded. The PMOS transistor 32 and the NMOS transistors 33–35 form a current/voltage conversion circuit 43. The node VOUT is an output of the current/voltage conversion circuit 43. For an input of the current/voltage conversion circuit 43, a drain of the NMOS transistor 46 is connected to drains of the NMOS transistors 33 and 34, and a gate and a source of the NMOS transistor 46 is connected to an output terminal of the inverter 45 and the node YX, respectively.

A drain of the PMOS transistor 52 is connected to source and gate of the NMOS transistor 53, a gate of the NMOS transistor 54 and to a drain of the NMOS transistor 55 through a node Vref. Source of the NMOS transistors 54 and 55 are grounded. A source of the PMOS transistor 52 is connected to a power supply. Gates of the PMOS transistor 52 and the NMOS transistor 55 are connected to an output terminal of the inverter 31. The PMOS transistor 32 and NMOS transistors 33–35 forms a current/voltage conversion circuit 44. An output of the current/voltage conversion circuit 44 is a signal Vref.

For an input of the current/voltage conversion circuit 44, a drain of the NMOS transistor 48 is connected to drains of the NMOS transistors 53 and 54, and a gate of the NMOS transistor 48 is connected to an output terminal of the inverter 45. A source of the NMOS transistor 48 is connected commonly to drains of the NMOS transistors 56 and 57. A source of the NMOS transistor 56 is connected to a node Iref1, which is a reference level. A gate of the NMOS transistor 56 is supplied with an activating signal nMULT. A source of the NMOS transistor 57 is supplied with the other reference level of Iref4. A gate of the NMOS transistor 57 is supplied with an activating signal MULT. An output node Vref of the current/voltage conversion circuit 44 is also connected to a gate of the NMOS transistor 33, forming the current/voltage conversion circuit 43.

Output signals VOUT and Vref of the current/voltage conversion circuits 43 and 44 are supplied to input terminals of the op-amplifier 36. An output terminal of the op-amplifier 36 is connected to an input terminal of the AND circuit 47. The other input terminal of the AND circuit 47 is connected to an output terminal of the inverter 45. An output signal DOUT is supplied from the AND circuit 47.

A drain of the PMOS transistor 38 and a source of the PMOS transistor 39 are connected serially. A source of the PMOS transistor 38 is connected to a power supply. A source of the NMOS transistor 40 and a drain of the NMOS transistor 41 are connected serially. A source of the NMOS transistor 40 is grounded. A drain of the PMOS transistor 39 and a drain of the NMOS transistor 40 are connected each other to form an output node. Gates of the PMOS transistor 38 and the NMOS transistor 41 are connected to an input node DIN. A signal WR is supplied to an input terminal of the inverter 42 and a gate of the NMOS transistor 40. Drains of the PMOS transistor 39 and NMOS transistor 40 are connected to a node YX.

Figure 10:
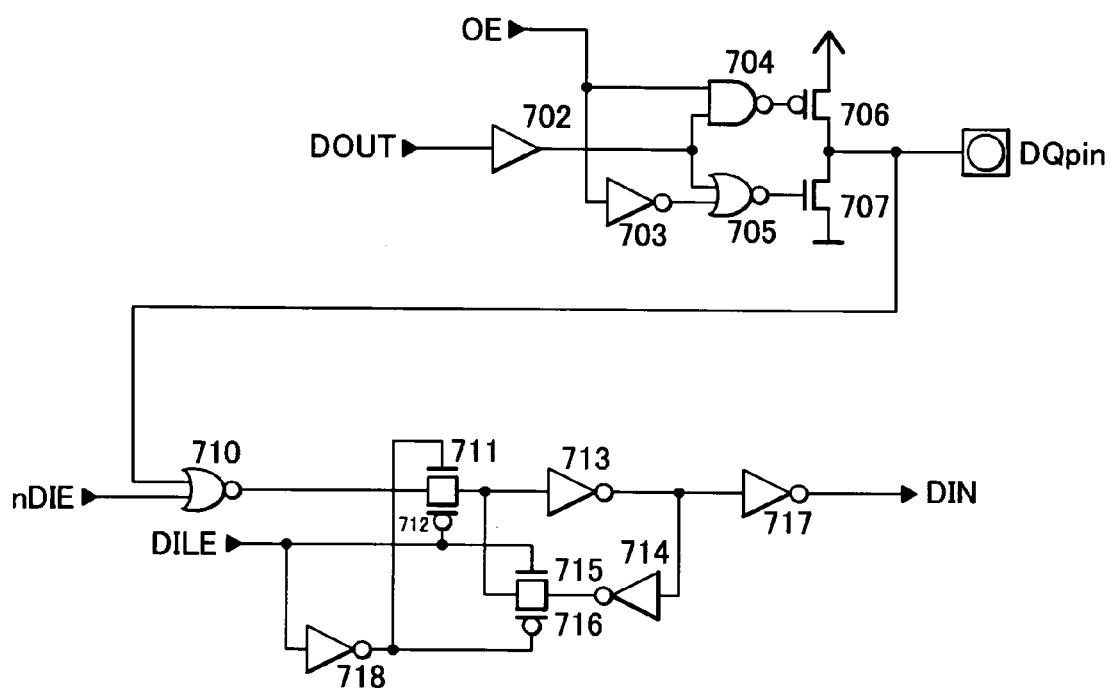
FIG. 10 is a circuit diagram showing an I/O buffer used in the second preferred embodiment shown in FIG. 7.

FIG. 10 is a circuit diagram showing an I/O buffer 272 used in the second preferred embodiment shown in FIG. 7. The I/O buffer 272 includes a buffer circuit 702; inverter circuits 703, 713, 714, 717 and 718; a NAND circuit 704; NOR circuits 705 and 710; PMOS transistors 706, 711 and 715; and NMOS transistors 707, 712 and 716.

A signal DOUT (shown in FIG. 9) is supplied to an input terminal of the buffer circuit 702. An output terminal of the buffer circuit 702 is connected to input terminals of the NAND circuit 704 and the NOR circuit 705. A signal OE is supplied to the other input terminal of the NAND circuit 704. The signal OE is also supplied to an input terminal of the inverter 703, an output terminal of which is connected to the other input terminal of the NOR circuit 705. An output terminal of the NAND circuit 704 is connected to a gate of the PMOS transistor 706. An output terminal of the NOR circuit 705 is connected to a gate of the NMOS transistor 707. Drains of the PMOS transistor 706 and the NMOS transistor 607 are commonly connected to a terminal DQpin. Source of he PMOS transistor 706 and the NMOS transistor 707 are connected to a power supply and a ground (earth), respectively.

Input terminals of the NOR circuit 710 are supplied with signals DQpin and nDIE. An output terminal of the NOR circuit 710 is connected to source of the NMOS transistor 711 and PMOS transistor 712. A common drain of the NMOS transistor 711 and PMOS transistor 712 is connected to an input terminal of the inverter 713 and to a common drain of the NMOS transistor 715 and PMOS transistor 716. A common source of the NMOS transistor 715 and PMOS transistor 716 is connected to an output terminal of the inverter 714. Input terminals of the inverters 714 and 717 are connected to an output terminal of the inverter 713. An output signal of the inverter 717 is a signal DIN. A signal DILE is supplied to gates of the PMOS transistor 712 and NMOS transistor 715 and to an input terminal of the inverter 718. An output signal of the inverter 718 is supplied to gates of the NMOS transistor 711 and PMOS transistor 716.

In the second preferred embodiment, when a X address for selecting word lines WL(m-7) to WL(m) is entered, the activating signal MULT becomes "1". To detect the value of the activating signal MULT, for example, a kind of simple decoder, detecting a specific combination of input from a X address, may be used.

When the activating signal MULT is "0", the reverse signal nMULT is "1". In accordance with address signals CA(0) to CA(K), one is selected from Y(0) to Y(4N), the NMOS transistor 56 is turned on, and a reference current Iref1 is selected in the R/W amplifier 271. When the activating signals nMULT and MULT are "1" and "0", respectively, a reading signal RD becomes "1"; and therefore, the R/E amplifier 271 perform a reading operation using a reference current Iref1. The detailed operation is the same as the first preferred embodiment.

In reading operation, when the read signal RD is "1" and the activating signal nMULT is "1", the inverter 31 supplies an output of "0", and the inverter 45 supplies an output of "1". Both the PMOS transistor 32 and the NMOS transistor 46 are turned on and the NMOS transistor 35 is turned off, so that the current-voltage conversion circuit 43 is activated. In the same manner, both the PMOS transistor 52 and the NMOS transistor 48 are turned on and the NMOS transistor 55 is turned off, so that the current-voltage conversion circuit 44 is activated. The NMOS transistor 56 is turned on in response to the activating signal nMULT at "1" level, while the NMOS transistor 57 is turned off in response to the activating signal MULT at "0" level. As a result, a reference current Iref1 is selected to be supplied to the current/voltage conversion circuit 44.

The amount of current flowing through the NMOS transistor 54 is defined by adding the amounts of current flowing through the NMOS transistors 53 and 48. In the same manner, the amount of current flowing through the NMOS transistor 34 is defined by adding the amounts of current flowing through the NMOS transistors 33 and 46. When the amount of current from YX is equal to the reference current Iref1, the signals VOUT and Vref have the same voltage level.

In more detail, when a current that is larger than the reference current Iref1 is supplied from YX, the amount of current flowing through the NMOS transistor 46 is increased. As a result, the current flowing through the NMOS transistor 33 is limited and an output VOUT of the current/voltage conversion circuit 43 is increased. When an output voltage VOUT of the current/voltage conversion circuit 43 becomes larger than a reference voltage Vref, which is an output of the current/voltage conversion circuit 44, according to the operation of the op-amplifier 36, the output level of the op-amplifier 36 is turned to low level and the AND circuit 47 supplies an output signal of "0".

In contrast, when a current that is not larger than the reference current Iref1 is supplied from YX, the amount of current flowing through the NMOS transistor 33 is increased. As a result, an output VOUT of the current/voltage conversion circuit 43 is decreased. When an output voltage VOUT of the current/voltage conversion circuit 43 becomes lower than a reference voltage Vref, which is an output of the current/voltage conversion circuit 44, according to the operation of the op-amplifier 36, the output level of the op-amplifier 36 is turned to high level and the AND circuit 47 supplies an output signal of "1".

In writing operation, when a writing signal WR become "1", the inverter 42 supplies an output signal "0". Both the PMOS transistor 39 and NMOS transistor 40 are turned on, a reverse data of DIN is outputted to the terminal YX. When the signal DIN is "0", the PMOS transistors 38 and 39 are turned on, and the NMOS transistors 40 and 41 are turned off. As a result, drains of the PMOS transistors 39 and 40 becomes at a power supply level. On the other hand, when the signal DIN is "1", the PMOS transistors 38 and 39 are turned off, and the NMOS transistors 40 and 41 are turned off. As a result, drains of the PMOS transistors 39 and 40 becomes at a ground level.

A voltage at the terminal YX is applied to a drain of a memory cell that is arranged at an intersection of one from Y(0) to Y(4N) and one from word lines WL(0) to WL(m-8), which are selected based on a write address. In writing operation, one of the word lines WL(0) to WL(m-8) is at a high voltage level and a predetermined data is written in the corresponding memory cell. Although, in the second preferred embodiment, a drain voltage of a memory cell in writing operation is determined lower than a power supply level, voltage (electrical potential) condition may be changed.

Next, the operation with the I/O buffer 172 will be described. Referring FIG. 10, the buffer 702 transmits a signal DOUT to the NAND circuit 704 and the NOR circuit 705.

When an output enable signal OE is "1", the chip is in an output mode, so that an output signal of DOUT is outputted through the terminal DQpin. In this case, nDIE is "1" and DILE is "1".

In writing operation, both the signals nDIE and DILE is "0". In response to a "0" level of the signal nDIE, the NOR circuit 710 is activated, and an input level of the signal DQpin is reversed and supplied to a transfer gate, formed by the NMOS transistor 711 and the PMOS transistor 712. In such a transfer gate, the PMOS transistor 712 and the NMOS transistor 711 are in the on state when the signal DILE is "0". A gate of the NMOS transistor is supplied with a signal, which is reversed by the inverter 718. An output signal of the NOR circuit 710 is supplied to an input terminal of the inverter 713. An output of the inverter 713 is reversed by the inverter 714 and the inverter 717. An output signal of the inverter 717 is supplied to R/W amplifier 271 as a signal DIN. In this case, the transfer gate, formed by the NMOS transistor 715 and the PMOS transistor 716, is maintained being off.

While the signal DILE is "1", a transfer gate formed by the PMOS transistor 712 and the NMOS transistor 711 is in the off state, and a transfer gate formed by the NMOS transistor 715 and the PMOS transistor 716 is in the on state. A data transferred to an output terminal of the inverter 713 during a period of time in which the signal DILE is "0" is reversed by the inverter 714. The reversed data is again transferred to an input terminal of the inverter 713 through a transfer gate, formed by the NMOS transistor 715 and the PMOS transistor 716. As a result, a data transferred to an output terminal of the inverter 713 during a period of time in which the signal DILE is maintained at "0" is buffered.

When the activating signal MULT is "1", the reverse signal nMULT is "0" and all of Y(0) to Y(4N) are selected at the same time in accordance with an input address CA(2) to CA(K). The NMOS transistor 507 is turned on, and a reference current Iref4 is selected in the R/W amplifier 271.

In reading operation, when the read signal RD is "1" and the activating signal nMULT is "1", the inverter 31 supplies an output of "0", and the inverter 45 supplies an output of "1". The PMOS transistors 32 and 52 and the NMOS transistors 46 and 48 are turned on and the NMOS transistor 55 is turned off, so that the current-voltage conversion circuits 43 and 44 are activated. The NMOS transistor 56 is turned off in response to the activating signal nMULT at "0", while the NMOS transistor 57 is turned on in response to the activating signal MULT at "1". As a result, a reference current Iref4 is selected to flow in the current/voltage conversion circuit 44.

In more detail, when a current that is larger than the reference current Iref4 is supplied from YX, the current flowing through the NMOS transistor 33 is limited and an output VOUT of the current/voltage conversion circuit 43 is increased. When an output voltage VOUT of the current/voltage conversion circuit 43 becomes larger than a reference voltage Vref, which is an output of the current/voltage conversion circuit 44, according to the operation of the op-amplifier 36, the output level of the op-amplifier 36 is turned to low level and the AND circuit 47 supplies an output signal of "0".

In contrast, when a current that is not larger than the reference current Iref4 is supplied from YX, the amount of current flowing through the NMOS transistor 33 is increased. As a result, an output VOUT of the current/voltage conversion circuit 43 is decreased. When an output voltage VOUT of the current/voltage conversion circuit 43 becomes lower than a reference voltage Vref, which is an output of the current/voltage conversion circuit 44, according to the operation of the op-amplifier 36, the output level of the op-amplifier 36 is turned to high level and the AND circuit 47 supplies an output signal of "1".

The reference current Iref4 for multi-cell operation is determined to be larger than the reference current Iref1 for single-cell operation. According to the embodiment, the reference current Iref4 is determined to be double of the reference current Iref1, and data stored in the corresponding four memory cells are read out simultaneously or concurrently. Even if one piece of data stored in a memory cell has been reversed accidentally, a desired accurate data would be outputted as long as the other three memory cells store the same and right data.

In writing mode, when a write signal WR becomes "1", all of Y(0) to Y(4N) are selected at the same time in accordance with an input address CA(2) to CA(K). The same data are written concurrently into those four memory cells. The detailed description will be omitted, because operation of R/W amplifier 271 is the same between the cases in which the activating signal MULT is "0" and "1".

As described above, according to the second preferred embodiment of the present invention, the same data is written in a plurality of memory cells concurrently and the data are read out simultaneously. The reading operation is carried out with a reference current, which is larger than that in case a data is read out from a single memory cell. As a result, even if one of memory cells does not work and stores a reversed data, an output would have an expected data accurately.

Further, the non-volatile memory device includes a memory cell array in which a single bit data is stored in a single memory cell one-by-one, so that data that is not required high reliability such as audio data can be stored in those memory cells. On the other hand, data that is required a high reliability and to be rewritten frequently such as ID code and phone numbers can be stored in memory cells one bit per four cells. Even if a memory cell is originally damaged in a fabrication process such as a bit-contact-open failure, data stored and read out simultaneously from four memory cells may keep its reliability and accuracy.

Further more, as compared to the above-described first preferred embodiment, column switches are arranged in a single system, so that the chip can be designed small in size.

Figure 11:
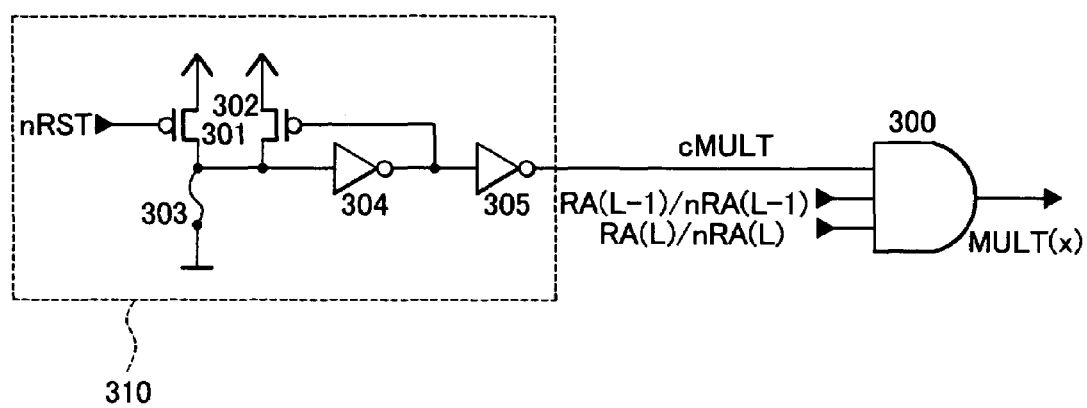
FIGS. 11 and 12 are logic diagrams showing a set-up circuit according to a third preferred embodiment of the present invention, which is applicable to the first and second preferred embodiments shown in FIGS. 1 and 7.
Figure 12:
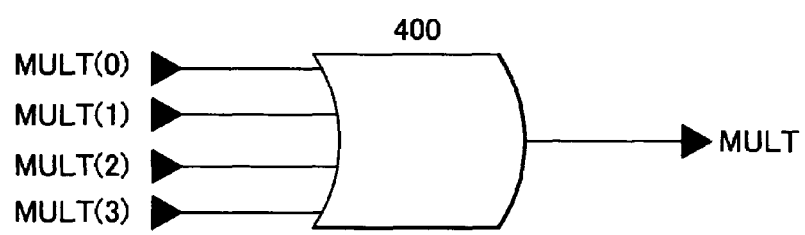

FIGS. 11 and 12 are logic diagrams showing a set-up circuit according to a third preferred embodiment of the present invention, which is applicable to the first and second preferred embodiments shown in FIGS. 1 and 7. The circuit shown in FIG. 11 includes an AND circuit 300; PMOS transistors 301 and 302; a laser fuse 303; and inverter circuits 304 and 305.

The set-up circuit shown in FIG. 11 is a circuit that selects and determines one from first type and second type of memory cell arrays for use. The first type of memory cell array corresponds to the memory array A1 and A2, shown in FIGS. 1 and 7. The second type of memory cell array corresponds to the memory cell array B1 and B2, shown in FIGS. 1 and 7. In the first type of memory cell array, a single bit data is stored concurrently in a plurality of memory cells, and read out simultaneously from those memory cells. In the second type of memory cell array, a single bit data is stored in a single memory cell one-by-one. According to this embodiment, memory cells are segmented into for memory cell arrays.

An input terminal of the AND circuit 300 is supplied with row address signals RA(L-1)/nRA(L-1) and RA(L)/nRA(L), which are the first two bits of RA(0)/nRA(0)–RA(L)/nRA(L). Another input terminal of the AND circuit 300 is supplied with an output signal eMULT of the defining circuit 310. The AND circuit 300 supplies an output signal of MULT(x).

Referring FIG. 12, activating signals MULT(0) to MULT(3) are supplied to input terminals of an OR circuit 400. The OR circuit 400 supplies an output signal of MULT, which is may be supplied to the R/W amplifiers 170, 171 and 271.

Now referring FIGS. 11 and 12 and describe operation of the third preferred embodiment, when the laser fuse 303 is not disconnected electrically, a reset signal nRST becomes "0" level and the PMOS transistor 301 charges an input of the inverter circuit 304. An input of the inverter circuit 304 is grounded, because the fuse 303 is in a connected condition. An output of the inverter circuit 304 is at a power supply level, so that the PMOS transistor 302 keeps an off state, the signals eMULT and MULT(x) keep at "0".

When the laser fuse 303 is disconnected electrically, the reset signal nRST becomes "0" level and the PMOS transistor 301 charges an input of the inverter circuit 304. The input terminal of the inverter circuit 304 becomes at a power supply level, and the output terminal of the inverter circuit 304 is grounded. The PMOS transistor 302 is turned on.

Even if the reset signal nRST is later returned to "1" level, the input terminal of the inverter circuit 104 is maintained at the power supply level. As a result, the output terminal of the inverter circuit 304 is at the ground level, so that the signal eMULT becomes "1". In accordance with a combining way of row addresses of RA(L-1)/nRA(L-1) and RA(L)/nRA(L), the signal MULT(x) may be "1".

The signal MULT(x) would become "1", when both values of RA(L-1)/nRA(L-1) and RA(L)/nRA(L) are "1" and the signal eMULT is "1". Further, in accordance with the operation of the OR circuit 400, shown in FIG. 12, the signal MULT becomes "1" and a single-bit/multi-cell storage mode is selected. In accordance with the operation of the first and second preferred embodiments, a single bit data is stored in a plurality of memory cells concurrently or in parallel, and the data are read out from the memory cells simultaneously or concurrently.

When neither RA(L-1)/nRA(L-1) nor RA(L)/nRA(L) is "1", or the signal eMULT is "0", the signal MULT(x) becomes "0" and a single bit data is stored in a single memory cell and is read out from the memory cell one-by-one.

According to the third preferred embodiment, a memory cell array is divided or segmented into a plurality of different arrays, and each of the segmented arrays is defined to be used for a plural-cell mode or a single-cell mode. As a result, for example, in a fabrication process or in a testing process, a specific segmented array in the entire array can be defined to be used for a plural-cell mode or a single-cell mode easily. In other words, memory cells can be easily segmented (grouped) or defined to be used for a plural-cell mode or a single-cell mode freely.

The laser fuse 303 can be replaced by another device, such as a non-volatile memory element. Segmentation of memory cells are not limited by the above described way, but the memory cells can be segmented in an unequal manner. Further, segmentation of memory cells to define their operation modes may be carried out for a specific region of the entire memory cell array.

In the present invention, memory array configuration; and logic configuration of the column switches and column selection signals are not limited by the first to third embodiments. According to the embodiments, a current sense technique is employed, but other types of sensing technique can be used. The configuration of the R/W amplifiers is not limited by the embodiments. Instead of or in addition to the above-described embodiments, other operation mode can be applied. A single bit data can be written in and read out with any numbers of memory cells, in addition to four, such as two, three, five, six or the like.

Memory cells having floating gates may be formed in matrix on a silicon substrate or in a well region on a silicon substrate. Sources of the memory cells may be commonly connected to a common source line, which is a first diffusion layer. A second diffusion layer may be directly or via selection gates to bit lines; and control gates may be connected to word lines. The bit lines may be provided with selecting circuits. In reading operation, a sense circuit is connected to the bit lines through the selecting circuits, so that the sense circuit electrically compares the bit lines with a reference value (signal).

What is claimed is:

1. A non-volatile memory device, comprising:
   a first memory cell array having memory cells, in which one bit data is stored by a plurality of memory cells;
   a second memory cell array having memory cells, in which one bit data is stored by a single memory cell;
   a reference signal generating circuit that generates first and second reference signals, which are used for reading data stored in the first memory cell array and the second memory cell array, respectively; and
   a sense circuit that accesses the first and second memory cell arrays according to the first and second reference signals, respectively.

2. A non-volatile memory device according to claim 1, wherein
   the same data is written in selected memory cells in the first memory cell array, and a data is read out simultaneously from the selected memory cells.

3. A non-volatile memory device according to claim 1, wherein
   the first reference signal is greater than the second reference signal.

4. A non-volatile memory device according to claim 1, wherein
   a single bit data is stored by four memory cells in the first memory cell array.

5. A non-volatile memory device according to claim 1, further comprising:
   a set-up circuit that generates and stores an activate/inactivate signal supplied to the sense circuit to institute whether a specific region of memory cell array is to be used as the first memory cell array or the second memory cell array.

6. A non-volatile memory device, according to claim 1, further comprising:
   a X-decoder coupled to gates of the memory cells in the first and second memory cell arrays;
   a common source line coupled to source of the memory cells in the first and second memory cell arrays;
   bit lines coupled to drains of the memory cells in the first and second memory cell arrays;
   column selection switches formed by transistors, drains of which are coupled to the bit lines; and
   a node coupled to sources of the column selection switches and to the sense circuit.

7. A non-volatile memory device according to claim 6, wherein
   the same data is written in selected memory cells in the first memory cell array, and a data is read out simultaneously from the selected memory cells.

8. A non-volatile memory device according to claim 6, wherein
   the first reference signal is greater than the second reference signal.

9. A non-volatile memory device according to claim 6, wherein
   a single bit data is stored by four memory cells in the first memory cell array.

10. A non-volatile memory device according to claim 6, further comprising:
    a set-up circuit that generates and stores an activate/inactivate signal supplied to the sense circuit to institute whether a specific region of memory cell array is to be used as the first memory cell array or the second memory cell array.

11. A non-volatile memory device according to claim 1, wherein
    the sense circuit comprises a first sense amplifier, which accesses the first memory cell array according to the first reference signal; and a second sense amplifier, which accesses a second memory cell array according to the second reference signal.

12. A non-volatile memory device according to claim 11, wherein
the same data is written in selected memory cells in the first memory cell array, and a data is read out simultaneously from the selected memory cells.

13. A non-volatile memory device according to claim 11, wherein
the first reference signal is greater than the second reference signal.

14. A non-volatile memory device according to claim 11, wherein
a single bit data is stored by four memory cells in the first memory cell array.

15. A non-volatile memory device according to claim 11, further comprising:
a set-up circuit that generates and stores an activate/inactivate signal supplied to the sense circuit to institute whether a specific region of memory cell array is to be used as the first memory cell array or the second memory cell array.

16. A non-volatile memory device according to claim 1, wherein
the sense circuit comprises a single sense amplifier, which accesses both the first and second memory cell array according to the first and second reference signals.

17. A non-volatile memory device according to claim 16, wherein
the same data is written in selected memory cells in the first memory cell array, and a data is read out simultaneously from the selected memory cells.

18. A non-volatile memory device according to claim 16, wherein
the first reference signal is greater than the second reference signal.

19. A non-volatile memory device according to claim 16, wherein
a single bit data is stored by four memory cells in the first memory cell array.

20. A non-volatile memory device according to claim 16, further comprising:
a set-up circuit that generates and stores an activate/inactivate signal supplied to the sense circuit to institute whether a specific region of memory cell array is to be used as the first memory cell array or the second memory cell array.

* * * * *